United States Patent

Kabeshita et al.

[11] Patent Number: 5,116,228
[45] Date of Patent: May 26, 1992

[54] METHOD FOR BUMP FORMATION AND ITS EQUIPMENT

[75] Inventors: Akira Kabeshita; Yoshifumi Kitayama, both of Hirakata, Japan

[73] Assignee: Matsushita Electric Industrial Co., Ltd., Osaka, Japan

[21] Appl. No.: 425,841

[22] Filed: Oct. 23, 1989

Related U.S. Application Data

[63] Continuation-in-part of Ser. No. 425,832, Oct. 20, 1989, abandoned.

[30] Foreign Application Priority Data

Oct. 20, 1988 [JP] Japan .................. 63-264527

[51] Int. Cl.$^5$ .................. H01R 9/00; B23K 20/00
[52] U.S. Cl. .................. 29/842; 228/3.1; 228/180.2; 29/840; 174/261
[58] Field of Search .................. 29/840, 842, 844; 174/260, 52.4; 228/56, 3.1, 180.2, 179; 437/183, 185, 209

[56] References Cited

U.S. PATENT DOCUMENTS

| | | | |
|---|---|---|---|
| 3,330,026 | 7/1967 | Best et al. | 437/209 X |
| 3,373,481 | 3/1968 | Lins et al. | 174/261 X |
| 3,380,155 | 4/1968 | Burks | 228/180.2 X |
| 3,589,000 | 6/1971 | Galli | 228/180.2 X |
| 3,918,144 | 11/1975 | Mimata et al. | 29/840 X |
| 4,237,607 | 12/1980 | Ohno | 29/840 |
| 4,818,728 | 4/1989 | Rai et al. | 29/739 X |
| 4,830,264 | 5/1989 | Bitaillou et al. | 228/180.2 |

OTHER PUBLICATIONS

IBM Tech Disclosure Bull vol. 23 No. 5 Oct. 1980 pp. 1877-1878 by B. D. Martin et al.

Primary Examiner—Carl J. Arbes
Attorney, Agent, or Firm—Wenderoth, Lind & Ponack

[57] ABSTRACT

A method and apparatus is provided for forming bumps on a plurality of IC chips arranged in a checkered pattern on a wafer. The bumps are formed from bump bases fixed to each IC chip. A forming tool having a recessed part of a height that is greater than the height of the bump bases is used to deform the bump bases into bumps. The forming tool is pressed by an elevating driving device against the bump bases under pressure sufficient to deform a respective part of each of the bump bases secured to each IC chip into a shape corresponding to that of the recess defined by the forming tool.

5 Claims, 3 Drawing Sheets

METHOD FOR BUMP FORMATION AND ITS EQUIPMENT

CROSS-REFERENCE TO RELATED APPLICATIONS

This application is a continuation-in-part of application Ser. No. 425,832, filed Oct. 20, 1989, now abandoned.

BACKGROUND OF THE INVENTION

1. Field of the Invention

The present invention relates to a method of bump formation and more specifically to a method of IC chip bump formation performing the flip chip bonding.

2. Description of the Prior Art

Conventionally, the metal plating method is generally used in order to form bumps o aluminum electrodes for IC chips. However, as is shown FIG. 7, a bump 32 formed on an IC chip 31 using metal plating is plateau-shaped and the height-h is usually not more than 15 μm.

When the flip chip bonding is used to install IC chips directly on bases, the difference between those materials may cause cracks in the joint part because of a stress concentration therein due to the differential thermal expansion coefficients for temperature changes and may result a major cause of malfunctions due to disconnections.

In order to solve the above-mentioned problem, tall bumps are formed so as to absorb the differences of thermal expansion by deformation of the bumps, but in this method it is necessary to form bumps with a height of at least 50 μm.

However, the prior art has not given a method to form bumps having a preferable height without dispersions with a low cost.

Taking the above-mentioned conventional problem into consideration, the object of the present invention is to provide a method for bump formation which can form bumps having a preferable height without dispersions with a low cost.

SUMMARY OF THE INVENTION

In order to achieve the above-mentioned object, the present invention is characterized in that a bump base with a plateau-shape and preferable height is formed by the metal plating, and a forming tool having a forming recessed parts or the plurality of them therein can be pressurized on the said bump base, forming bumps sticking out upward.

Applied pressure of the said forming tool may be preferably adjusted within a range wherein a preferable height of bumps can be obtained and a plain face of the bump base can not be deformed.

Furthermore, the formation of the bumps can be processed in order or en bloc on each IC chip.

In addition, the said forming tool may be preferably provided with a taller height than of the bump base, a smaller flat area of the opening than of the bump base and a forming recessed part having a draft.

Moreover, the present invention provides a bump forming equipment comprising a supporting method on which an IC chip or an aggregate of IC chips having bump bases thereon is secured, a forming tool with a forming recessed part or the plural of them which forms sticking out bumps by being pressurized on the bumps on the IC chip secured on the supporting method, a pressurizing method which can drive the forming tool toward the bump bases and is adjustable about its applying pressure on the bump bases.

By using the methods disclosed by the present invention, the formation of bumps with a preferable height can be obtained easily with a low cost because taller bumps are formed in plastic processing only by pressurizing the forming tool with the forming recessed part onto the bump bases made by metal plating. Those bumps have enough height which can be processed without dispersions.

Furthermore, the defect that bump bases may stick out sidewards making the intervals between other adjacent ones narrower is removable by adjusting the applying pressure while the height of bumps is kept preferable.

Moreover, a simple forming tool is usable when bumps are formed in order and the wire bonding technic is applicable to the forming operation in that case. On the other hand, when bumps are formed en bloc, a complicated forming tool is necessary but a better processing efficiency is available.

Bumps with preferable height and shape can be stably supplied by using a forming tool comprising a taller forming recessed part than of bump base, a smaller flat area of the opening than of bump base and a draft which can work together to smoothly build up the thickness of bumps.

BRIEF DESCRIPTION OF THE DRAWINGS

FIG. 1 (a) and (b) are schematic diagrams of a pressurizing forming process for bumps.

FIG. 2 is a perspective view of a bump after being formed.

FIG. 3 is a perspective view of a bump pressurizing forming equipment.

FIG. 4 is a partially schematic perspective view of the above-mentioned equipment.

DESCRIPTION OF THE PREFERRED EMBODIMENT

One preferred mode of carrying out the present invention is described below with reference to FIGS. 1 through 4.

Figure 1A:
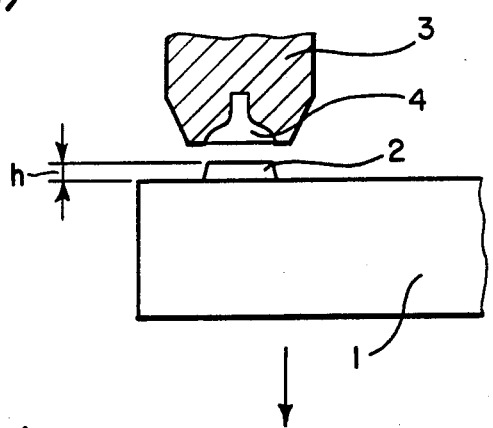
FIG. 1–FIG. 4 show one preferred mode of the present invention.
Figure 1B:
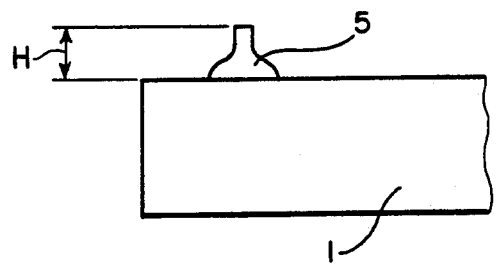
Figure 2:
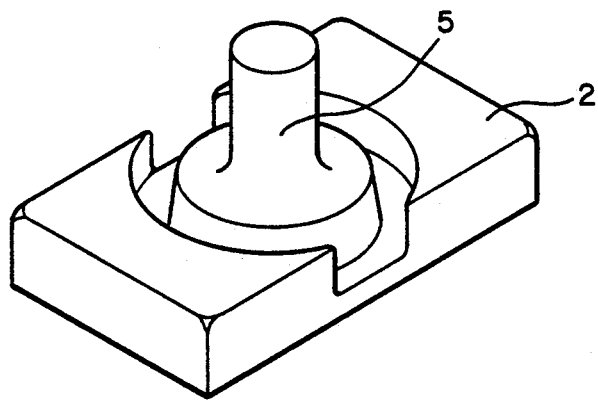
Figure 7:
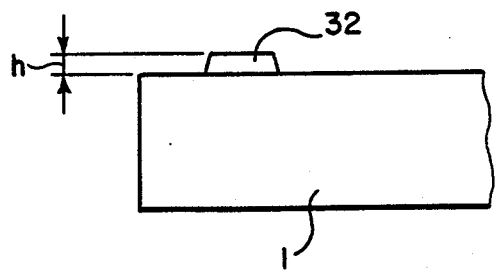
FIG. 7 is a front view showing a bump on a conventional IC chip.

FIG. 1 (a) shows an IC chip 1 on which a bump base 2 having roughly a rectangular shaped flat face with the height of about 15 μm is formed by metal plating. Number 3 shows a forming tool and at the lower end face of the said tool there is a forming recessed part 4 conformed to the predetermined shape of the bump. The said recessed part 4 has a taller height than that of the bump 2 conforming to the determined bump height, and the flat face of the lower end opening is made round-shaped with a smaller diameter than the short side length of the bump base. Moreover, a draft is given to the recessed part with its cross-sectional area reducing as it comes upward, and the said forming tool is assembled so that it can apply pressure onto the said bump base 2.

By moving said forming tool 3 towards said bump base 2 and pressurizing it on the base, there is formed a bump 5 with the part of the base corresponding to the forming recessed part 4 sticking out upward and having a preferable height-H. In this case, the portion on the bump base surrounded by the lower opening edge of the forming tool 3 can flow smoothly into the forming recessed part 4, forming a bump 5 stably and accurately because the flat face of the opening of the forming recessed part is made round-shaped with a smaller diameter than the short side length of the bump base and a draft is also given to the recessed part. Applying pressure is also controlled so that it can move a portion of the base large enough to form a bump 5 with a preferable height and it may not be too large to deform the bump base sidewards in its flat face shape.

The pressure value is usually within 100 through 500 g though it may very depending on the material and its size or thickness of the bump base.

Figure 3:
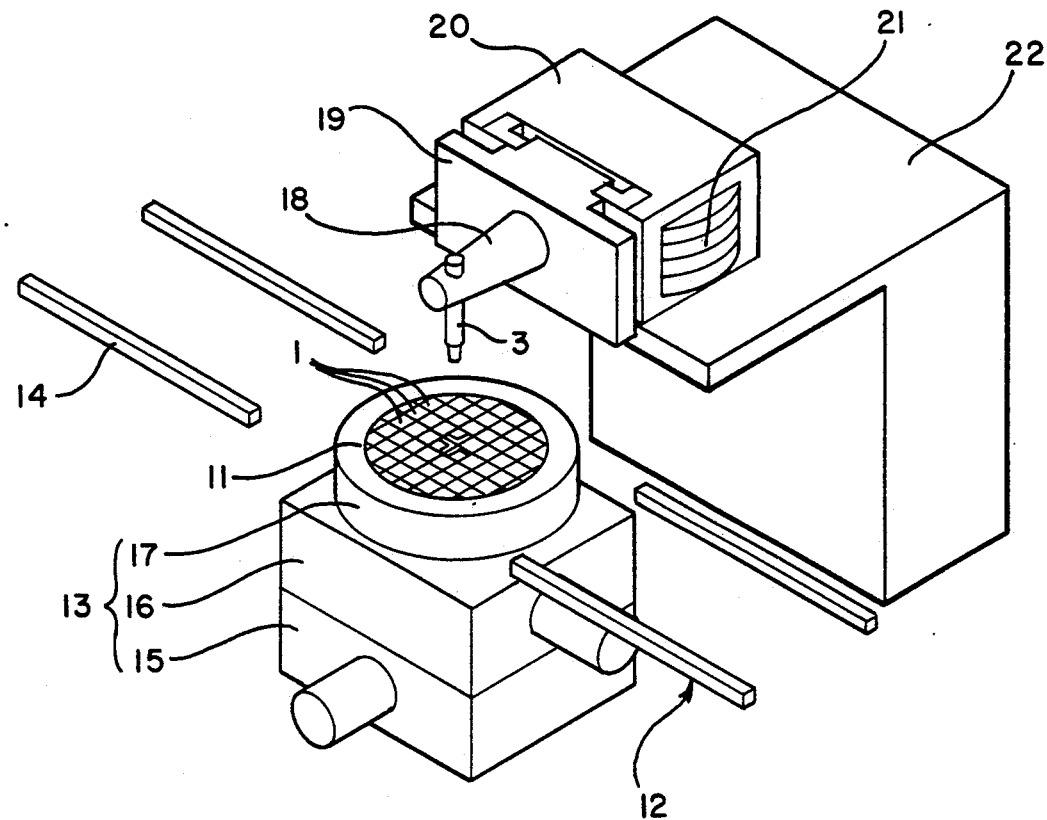
Figure 4:
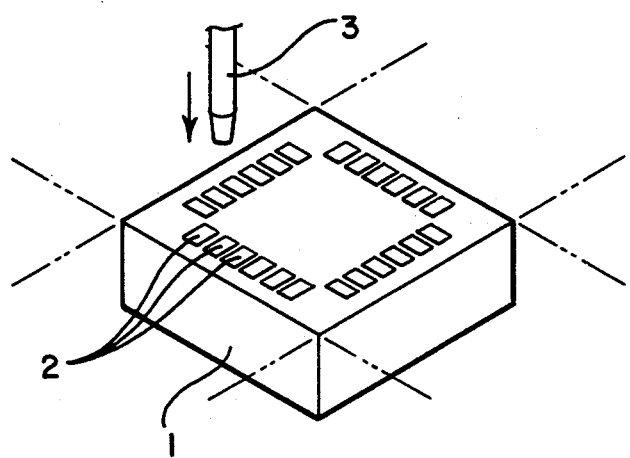

Next, explanations are given on equipment and its action to pressurize the bump base 2 with the forming tool 3 in reference to FIG. 3, as well as 4. Lots of above-mentioned IC chip 1 are built up on a wafer 11 in a checked pattern, and each IC chip 1 comprises lots of bump bases 2 along the four sides as shown in FIG. 4. This wafer 11 is supplied on shifting means 13 by carrying-in means 12 and is taken out by carrying-out means 14. The shifting means 13 consists of X15, Y16 and $\theta$17 axis tables in a laminated structure, and a large number of IC chips 1 or bump bases 2 secured on the $\theta$ axis table 17 are assembled to shift each position to a predetermined location in order. The said forming tool 3 which can move up and down is installed right above the predetermined position. More specifically, the forming tool 3 is secured to an elevating body 19 through its horn-like mounting member 18 and the elevating body 19 is assembled so that it can be driven up and down at high speeds by an elevating driving device 20 with a voice coil 21. Applying pressure by the forming tool 3 is preferably adjustable by controlling applied voltage to the voice coil 21. Number 22 is a mounting base for the elevating driving device 20.

In accordance with the above-mentioned composition, the wafer is placed and secured on the $\theta$ axis table and the bump base with a large number of IC chips built up is successively disposed on the predetermined position right under the forming tool 3 by actuating each table, 15, 16, or 17, and then by lowering the forming tool 3 using the elevating driving device 20 and pressurizing the bases at preferable applied pressure, the bumps 5 corresponding to the shape of the recessed part 4 in the forming tool 3 can be successively formed. Furthermore, when a modified forming tool 3 provided with forming recessed parts each of which corresponds to every one of all the bump base 2 on an IC chip 1 is used, every IC chip 1 is successively disposed at a predetermined position and pressurized by the said forming tool 3 en bloc, resulting in an efficient bump formation.

Figure 5A:
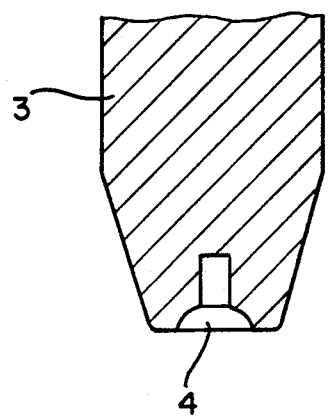
FIG. 5 (a) as well as (b) is a cross-sectional view showing an example of a shape of a forming recessed part.
Figure 5B:
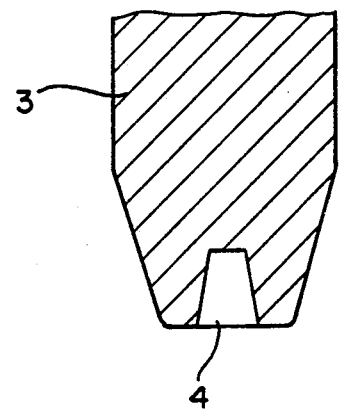
Figure 6A:
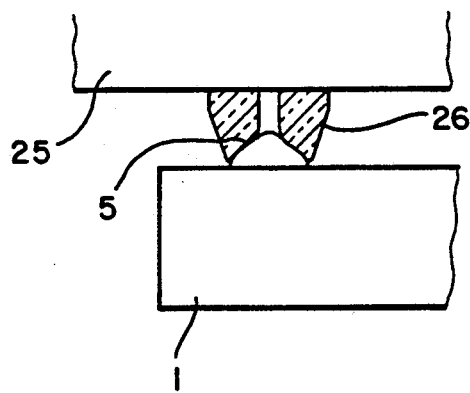
FIG. 6 (a) and (b) are schematic diagrams showing joining conditions between an IC chip and a substrate by the use of a bump formed.
Figure 6B:
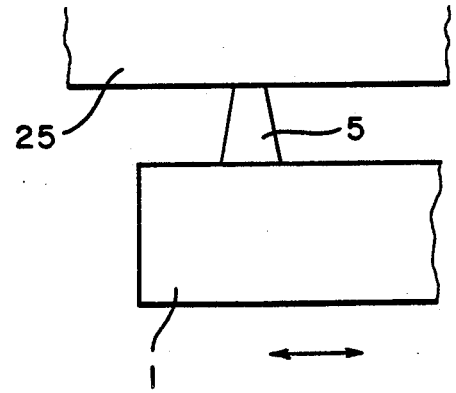

The forming recessed part 4 in the said forming tool 3 as well as the size or shape of the bump 5 to be formed can be preferably designed according to the production plan. Two of typical examples of the bump shape are shown in the figures of the above preferred embodiment. One has a wide waist-shaped part up to the mid-height with a part that sticks out from the center is shown in FIG. 5 (a) and FIG. 6 (a). The other has a conical trapezoid shape shown in FIG. 5 (b) and FIG. 6 (b). The bump with a waist shaped part and a part that sticks out is preferable when an IC chip 1 is connected to a substrate 25 with a conductive adhesive by the flap chip bonding method as is shown in FIG. 6 (a) since the conductive adhesive 26 can be supported by the waist shaped part, and the conical trapezoid shaped one is preferable when a bump 5 on IC chip 1 is joined to an electrode on a substrate 25 by the intermetallic junction because the bump 5 has a bending strength strong enough to endure ultrasonic waves.

Moreover, in the above mentioned preferred embodiment, the elevating driving device 20 provided with a voice coil 21 is shown as a pressurizing method for the forming tool 3, but preferable driving means such as linear motors, etc. can be used.

In accordance with the bump forming method of the present invention, as is apparent by the above-mentioned explanations, the following advantages are obtained:

(1) Bumps with a preferable height can be built up simply and with a low cost because they can be formed in a tall shape by the plastic processing only by pressurizing the forming tool with the recessed part onto the bump base made by metal plating.
(2) Bumps with enough height can be formed without dispersions by the use of the forming recessed part.
(3) The defect that bump bases might stick out sidewards, making the intervals between other adjacent ones narrower is preventable by adjusting the applying pressure while maintaining enough height of the bumps.
(4) A simple forming tool is usable when a successive forming method of bumps is taken while a complicated forming tool is necessary when bumps are processed en bloc, but in this case the efficiency of the processing is better.
(5) In accordance with the forming tool in the present invention, which comprises a taller forming recessed part than the bump base, a smaller flat face area of the opening than of the bump base and a draft, a portion on the bump base can be smoothly built up and bumps with a preferable height and shape can be obtained stably.
(6) By using the bump forming equipment provided with an adjustable pressurizing means for the forming tool, IC chips made by metal plating are usable, and therefore bumps with a tall height, without dispersions in the height and without sticking-out sidewards can be efficiently formed.

We claim:

1. A method of forming bumps on a plurality of IC chips, said method comprising:
   providing a wafer on which a plurality of IC chips are formed in a checkered pattern, each of said IC chips having a plurality of bump bases thereon of a certain height, width and length;
   providing a forming tool having at least one recessed part defining a respective recess extending into the forming tool, from an end of the tool constituting one end of the recessed part, and terminating at a location within the forming tool constituting the other end of the recessed part;
   each said at least one recessed part having a height, as taken between the ends thereof, that is greater than said certain height of the bump bases of the IC chip, respectively, and the recess having a draft in the direction from the one end to the other end of each said at least one recessed part; and pressing the forming tool, at said end thereof, against each of the bump bases under pressure sufficient to deform a respective part of each of the bump bases into a shape corresponding to that of the recess defined by each said at least one recessed part of the forming tool, so as to form pumps of said shape on the IC chips of a height greater than that of the bump bases from which said bumps were respectively formed.

2. The method as claimed in claim 1, wherein the step of providing a forming tool comprises providing a forming tool having only one said recessed part of the tool, the end of the forming tool having a diameter smaller than that of the length of the bump bases, and the step of pressing includes sequentially pressing the forming tool against the bump bases.

3. Bump forming apparatus for forming bumps on a plurality of IC chips, said apparatus comprising:

supporting means for supporting a wafer on which a plurality of IC chips are formed in a checkered pattern;

shifting means, connected to said supporting means, for shifting said supporting means in directions parallel to two axes extending orthogonally to one another, respectively;

a forming tool having at least one recessed forming part defining a respective recess in the tool;

an elevating body supporting said forming tool in the apparatus, and elevating driving means including a voice coil operatively connected to said elevating body for raising and lowering said elevating body toward and away from said supporting means, whereby a wafer on which a plurality of IC chips each having a plurality of bump bases thereon and supported by said supporting means is shiftable by said shifting means to a position at which the forming tool can be lowered by said elevating driving means under the operation of said voice coil until said at least one recessed forming part thereof deforms at least one of the bump bases into a bump projecting from each of the IC chips; and pressure adjusting means, operatively connected to said elevating driving means, for adjustably controlling voltage applied to said voice coil so as to establish the pressure under which said forming tool is lowered toward said supporting means, whereby the pressure, which the recessed forming part of said forming tool applies to the at least one of the bump bases on an IC chip supported by said supporting means to deform the same into a bump, is adjustable.

4. A method of forming bumps on an IC chip, said method comprising:

providing an IC chip having a plurality of bump bases fixedly secured thereto, each of the bump bases having a certain height, width and length;

providing a forming tool having at least one recessed part defining a respective recess extending into the forming tool, from an end of the tool constituting one end of the recessed part, and terminating at a location within the forming tool constituting the other end of the recessed part;

each said at least one recessed part having a height, as taken between the ends thereof, that is greater than said certain height of the bump bases of the IC chip, respectively, and the recess having a draft in the direction from the one end to the other end of each said at least one recessed part; and after said step of providing an IC chip having bump bases fixedly secured thereto, pressing the forming tool, at said end thereof, against each of the bump bases under pressure sufficient to deform a respective part of each of the bump bases fixedly secured to the IC chip into a shape corresponding to that of the recess defined by each said at least one recessed part of the forming tool, so as to form bumps of said shape on the IC chips of a height greater than that of the bump bases from which said bumps were respectively formed.

5. The method as claimed in claim 4, wherein the step of providing a forming tool comprises providing a forming tool having only one said recessed part of the tool, the end of the forming tool having a diameter smaller than that of the length of the bump bases, and the step of pressing includes sequentially pressing the forming tool against the bump bases.

* * * * *